United States Patent
Sun et al.

(10) Patent No.: US 10,572,025 B2
(45) Date of Patent: Feb. 25, 2020

(54) HANDWRITTEN SCREEN AND TOUCH DISPLAY DEVICE

(71) Applicants: BOE TECHNOLOGY GROUP CO., LTD., Beijing (CN); Beijing BOE Display Technology Co., Ltd., Beijing (CN)

(72) Inventors: Hanyan Sun, Beijing (CN); Weitao Chen, Beijing (CN); Inho Park, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/924,965

(22) Filed: Mar. 19, 2018

(65) Prior Publication Data

US 2019/0018496 A1  Jan. 17, 2019

(30) Foreign Application Priority Data

Jul. 11, 2017 (CN) .......................... 2017 1 0560497

(51) Int. Cl.
  *G06F 3/01* (2006.01)
  *G06F 3/041* (2006.01)
  (Continued)

(52) U.S. Cl.
  CPC .......... *G06F 3/017* (2013.01); *G02B 26/026* (2013.01); *G06F 3/041* (2013.01); *G06F 3/0412* (2013.01);
  (Continued)

(58) Field of Classification Search
  None
  See application file for complete search history.

(56) References Cited

U.S. PATENT DOCUMENTS 4,459,428 A    7/1984  Chou
2014/0014154 A1*  1/2014  Hayashi .................. H01L 35/32
                                                    136/205

(Continued)

FOREIGN PATENT DOCUMENTS

CN   101882017 A   11/2010
CN   104007853 A   8/2014
(Continued)

OTHER PUBLICATIONS

Office Action dated Sep. 4, 2019 issued in corresponding Chinese Application No. 201710560497.6.

*Primary Examiner* — Nicholas J Lee
(74) *Attorney, Agent, or Firm* — Nath, Goldberg & Meyer; Joshua B. Goldberg; Stephanie Majkut

(57) ABSTRACT

The present disclosure provides a handwritten screen and a control display device. The handwritten screen includes a plurality of pixels arranged in an array, and a first substrate and a second substrate both being electrically insulating and thermally conductive. Each of the plurality of pixels includes a thermoelectric generator and a display unit connected with each other, the thermoelectric generator and the display unit are between the first substrate and the second substrate, and the thermoelectric generator generates an electric field once there is a difference between a temperature of the first substrate and a temperature of the second substrate, so as to supply power to the display unit. The present disclosure effectively utilizes a difference in temperature between a finger (i.e., the first substrate) and an external environment (i.e., the second substrate) during touch, and converts thermal energy into electrical energy to perform thermoelectric power generation.

20 Claims, 3 Drawing Sheets

(51) Int. Cl.
*G02B 26/02* (2006.01)
*H01L 35/32* (2006.01)
*G02F 1/165* (2019.01)

(52) U.S. Cl.
CPC .......... *G06F 3/0416* (2013.01); *G02F 1/165* (2019.01); *H01L 35/32* (2013.01)

(56) References Cited

U.S. PATENT DOCUMENTS

2014/0266002 A1  9/2014  Nies et al.
2017/0192395 A1  7/2017  Zhang
2018/0293933 A1* 10/2018  Choi .................... G09G 3/3225

FOREIGN PATENT DOCUMENTS

| CN | 204615887 U | 9/2015 | |
|---|---|---|---|
| CN | 205680380 U | 11/2016 | |
| CN | 106773016 A | 5/2017 | |
| CN | 106933092 A | 7/2017 | |
| JP | 2006-40963 A | 2/2006 | |
| TW | 201522776 A | 6/2015 | |
| TW | 201618414 A | 5/2016 | |
| WO | WO-2009063805 A1 * | 5/2009 | ............. H01L 35/30 |

* cited by examiner

HANDWRITTEN SCREEN AND TOUCH DISPLAY DEVICE

CROSS REFERENCE TO RELATED APPLICATION

This application claims priority to Chinese Patent Application No. 201710560497.6, filed on Jul. 11, 2017, the contents of which are incorporated by reference in the entirety.

TECHNICAL FIELD

The present disclosure relates to the field of display technology, and particularly relates to a handwritten screen and a touch display device including the handwritten screen.

BACKGROUND

A traditional handwritten screen is implemented by additionally providing a touch screen on a liquid crystal panel and needs a power supply to supply power continuously. On the one hand, charging is inconvenient under a specific use environment, which affects continuous use of the handwritten screen; on the other hand, by additionally providing the power supply, the handwritten screen has a large volume and a heavy weight, which is in the opposite direction of the current trend that devices are made lighter and handier, and leads to inconvenient use.

SUMMARY

An object of the present disclosure is to provide a handwritten screen and a touch display device.

In one aspect, the present disclosure provides a handwritten screen, including a plurality of pixels arranged in an array, and a first substrate and a second substrate both being electrically insulating and thermally conductive, each of the plurality of pixels includes a thermoelectric generator and a display unit connected with each other, the thermoelectric generator and the display unit are between the first substrate and the second substrate, and the thermoelectric generator generates an electric field once there is a difference between a temperature of the first substrate and a temperature of the second substrate, so as to supply power to the display unit.

In an embodiment, the thermoelectric generator includes: at least one conductive post set each including a first conductive post and a second conductive post, the at least one conductive post set is sequentially connected in series, the first conductive post in the first conductive post set and the second conductive post in the last conductive post set are connected to the display unit, respectively, and a Seebeck coefficient of the first conductive post and a Seebeck coefficient of the second conductive post are different.

In an embodiment, the thermoelectric generator includes two conductive post sets, the second conductive post in the first conductive post set is connected to the first conductive post in the second conductive post set, the first conductive post in the first conductive post set and the second conductive post in the second conductive post set are connected to the display unit, respectively.

In an embodiment, the first conductive post and the second conductive post of each of the at least one conductive post set are semiconductors.

In an embodiment, the first conductive post is a P-type semiconductor and the second conductive post is an N-type semiconductor.

In an embodiment, the plurality of pixels are thermally insulated from each other.

In an embodiment, the first substrate includes: a base substrate, an electrically insulating and thermally conductive structure, and a first thermally insulating spacer layer and a second thermally insulating spacer layer both being grid-shaped, and the base substrate is provided with a plurality of through holes arranged in an array;

the first thermally insulating spacer layer and the second thermally insulating spacer layer are provided on two opposite surfaces of the base substrate, respectively, and opening areas of the first thermally insulating spacer layer and opening areas of the second thermally insulating spacer layer substantially correspond to opening areas of the pixels; and the electrically insulating and thermally conductive structure fills the through holes and covers the two surfaces of the base substrate, and adjoins with the first thermally insulating spacer layer and the second thermal insulating spacer layer.

In an embodiment, the electrically insulating and thermally conductive structure is made of a transparent material, and the first thermally insulating spacer layer and the second thermally insulating spacer layer are made of a non-transparent material.

In an embodiment, an orthographic projection of each of the at least one conductive post sets on the first substrate is within an orthographic projection of the first thermally insulating spacer layer or the second thermally insulating spacer layer on the first substrate.

In an embodiment, the display unit is specifically configured to display a first color under the action of the electric field.

In an embodiment, the display unit is an electronic ink display unit.

In an embodiment, the display unit includes a first electrode and a second electrode opposite to each other, a first barrier wall and a second barrier wall opposite to each other, a liquid medium and a plurality of rotating balls, the first electrode, the second electrode, the first barrier wall and the second barrier wall are perpendicular to the first substrate and the second substrate, and the first electrode, the second electrode, the first barrier wall, the second barrier wall, the first substrate and the second substrate form an enclosed space, the liquid medium is in the enclosed space, and the plurality of rotating balls suspend in the liquid medium; one hemispherical surface of each of the plurality of rotating balls has a first color, and the other hemispherical surface thereof has a second color;

the first electrode is connected to the first conductive post in the first conductive post set and the second electrode is connected to the second conductive post in the last conductive post set;

in a case where there is a difference between the temperature of the first substrate and the temperature of the second substrate, the plurality of rotating balls are rotated by 180 degrees under the action of the electric field such that the hemispherical surface of each of the plurality of rotating balls having the first color faces the first substrate.

In an embodiment, the first color is black and the second color is white.

In an embodiment, an interface between the hemispherical surface having the first color and the hemispherical surface having the second color of each of the plurality of rotating balls has one end coated with a transparent solution having positive ions, and the other end coated with a transparent solution having negative ions.

In an embodiment, the hemispherical surface having the first color and the hemispherical surface having the second color of each of the plurality of rotating balls are formed by using two oppositely charged materials.

In an embodiment, the thermoelectric generator is configured to generate, when a finger touches the first substrate, an electric field according to the difference between the temperature of the first substrate and the temperature of the second substrate, so as to supply power to the display unit.

The present disclosure further provides a touch display device, which includes the above handwritten screen.

DETAILED DESCRIPTION

Technical solutions in the present disclosure will be described clearly and thoroughly below with reference to the accompanying drawings in the present disclosure. Apparently, the embodiments described herein are merely a part of, but not all of, the embodiments of the present disclosure. Based on the embodiments in the present disclosure, all other embodiments obtained by a person of ordinary skill in the art without creative efforts shall fall within the protection scope of the present disclosure.

Figure 1:
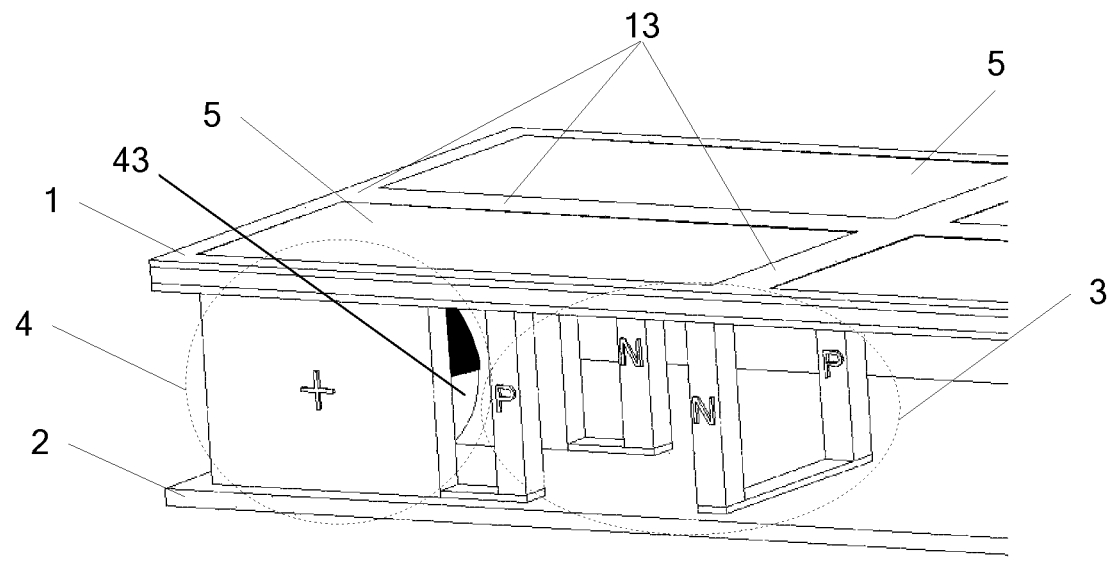
FIG. 1 is a schematic diagram illustrating a part of a structure of a handwritten screen provided in the present disclosure.
Figure 3:
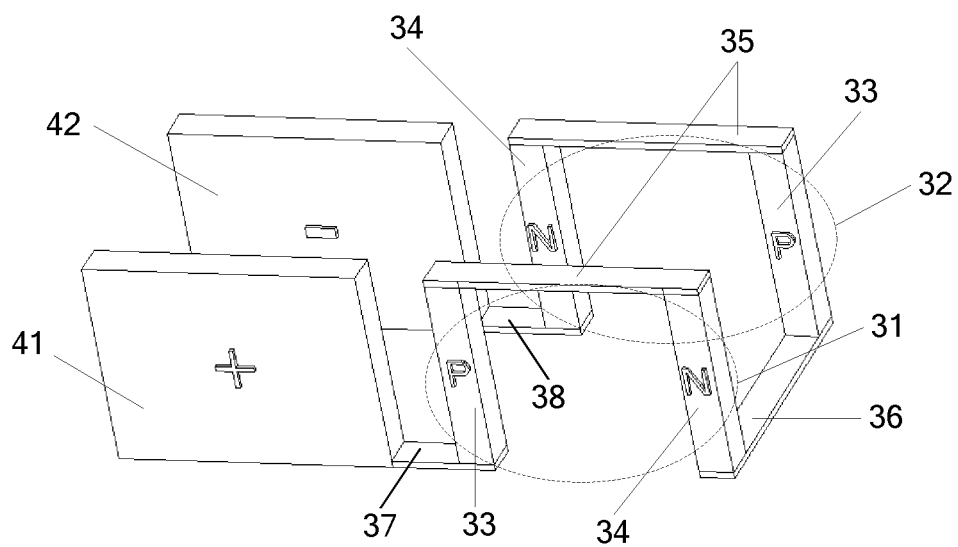
FIG. 3 is a schematic diagram illustrating connection between a thermoelectric generator and a display unit provided in the present disclosure.

The present disclosure provides a handwritten screen. As shown in FIG. 1 and FIG. 3, the handwritten screen includes a plurality of pixels 5 arranged in an array, and a first substrate 1 and a second substrate 2 both being electrically insulating and thermally conductive, and each pixel 5 includes a thermoelectric generator 3 and a display unit 4. The thermoelectric generator 3 and the display unit 4 are connected with each other and located between the first substrate 1 and the second substrate 2. The thermoelectric generator 3 generates an electric field when there is a difference between a temperature of the first substrate 1 and a temperature of the second substrate 2, so as to supply power to the display unit 4. For example, when a finger contacts the first substrate 1, the temperature of the first substrate 1 changes, so that the temperature of the first substrate 1 and the temperature of the second substrate 2 are different, and at this time, the thermoelectric generator 3 generates an electric field according to the difference between the temperature of the first substrate and the temperature of the second substrate, so as to supply power to the display unit 4.

It could be understood that, in addition to the above way of contacting the first substrate with a finger, other ways may also be used to cause a difference between the temperature of the first substrate 1 and the temperature of the second substrate 2 so that the thermoelectric generator 3 generates an electric field, such as the way of using a handheld heat source to contact or approach the first substrate 1, and the like. In addition, in addition to the way of increasing the temperature of the first substrate 1 to cause a difference between the temperature of the first substrate and the temperature of the second substrate, the temperature of the first substrate 1 may also be lowered (for example, to be lower than a temperature of a room where the second substrate is located) to make the temperature of the first substrate and the temperature of the second substrate different. Alternatively, the temperature of the first substrate 1 and the temperature of the second substrate 2 may be made different by changing the temperature of the second substrate 2 while maintaining the temperature of the first substrate 1, so as to cause the thermoelectric generator 3 to generate an electric field. Alternatively, the temperature of the first substrate 1 and the temperature of the second substrate 2 may be changed at the same time such that the temperature of the first substrate 1 and the temperature of the second substrate 2 are different, and the way of causing a difference between the temperature of the first substrate 1 and the temperature of the second substrate 2 is not limited in the present disclosure. It should be noted that since the plurality of pixels 5 are arranged in a matrix on the first substrate 1, each pixel 5 includes a thermoelectric generator 3 and a display unit 4 corresponding thereto. FIG. 3 shows only the thermoelectric generator 3 and the display unit 4 included in one pixel 5. In the handwritten screen provided in the present disclosure, the thermoelectric generator 3 and the display unit 4 corresponding to each pixel 5 are provided between the first substrate 1 and the second substrate 2. When a finger contacts the first substrate 1, the thermoelectric generator 3 can generate an electric field according to the difference in temperature between the first substrate 1 and the second substrate 2, and the electric field is used to supply power to the display unit 4 to realize touch display. The present disclosure effectively utilizes a difference in temperature between a finger (i.e., the first substrate 1) and an external environment (i.e., the second substrate 2) during touch, and converts thermal energy into electrical energy to perform thermoelectric power generation, so that the existing power supply can be replaced and no power supply needs to be additionally provided. Thus, the problem of inability to supply power continuously to a handwritten screen can be fundamentally solved and the handwritten screen is convenient to use. Moreover, the thermoelectric generator 3 can directly convert thermal energy into electrical energy when there is a slight difference in temperature, and in the conversion process, no mechanical moving part is required, and no gas or liquid medium exists, and therefore, the handwritten screen has small size and light weight, and is safe and reliable.

Figure 2:
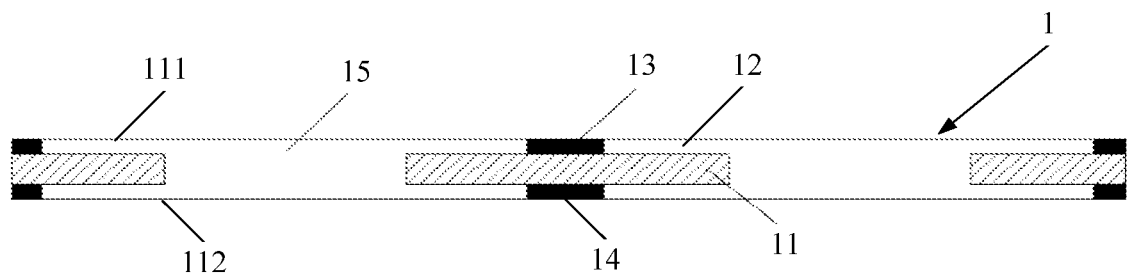
FIG. 2 is a schematic structural diagram of a first substrate provided in the present disclosure.

The specific structure of the first substrate 1 of the present disclosure will be described in detail below with reference to FIGS. 1 and 2.

In some embodiments, the plurality of pixels are provided to be thermally insulated from each other to increase display accuracy of each pixel. As shown in FIG. 2, the first substrate 1 may include: a base substrate 11, an electrically insulating and thermally conductive structure 12, and a first thermally insulating spacer layer 13 and a second thermally insulating spacer layer 14 both being grid-shaped, and the base substrate 11 is provided therein with a plurality of through holes 15 arranged in an array. The first thermally insulating spacer layer 13 and the second thermally insulating spacer layer 14 are provided on two opposite surfaces of the base substrate 11, respectively. As shown in FIG. 1, opening areas of the first thermally insulating spacer layer 13 and opening areas of the second thermally insulating spacer layer 14 correspond to opening areas (display areas) of the pixels 5. In other words, orthographic projections of the first thermally insulating spacer layer 13 and the second thermally insulating spacer layer 14 on the base substrate 11 do not overlap with the orthographic projections of the opening areas of the pixels 5 on the base substrate 11 at all, so as not to affect aperture ratio of the pixels. The electrically insulating and thermally conductive structure 12 fills the through holes 15 in the base substrate 11, and covers the two surfaces of the base substrate 11. In addition, the electrically insulating and thermally conductive structure 12 adjoins with the first thermally insulating spacer layer 13 and the second thermally insulating spacer layer 14, respectively. In other words, the electrically insulating and thermally conductive structure 12 fills the opening areas of the first thermally insulating spacer layer 13 and the second thermally insulating spacer layer 14. In an example shown in FIG. 2, the electrically insulating and thermally conductive structure 12 is provided only in the opening areas of the first and second thermally insulating spacer layers 13 and 14, but not on surfaces of the first and second thermally insulating spacer layers 13 and 14 away from the base substrate 11. An upper surface of the electrically insulating and thermally conductive structure 12 is flush with an upper surface of the first thermally insulating spacer layer 13 (the surface of the first thermally insulating spacer layer 13 away from the base substrate 11), and a lower surface of the electrically insulating and thermally conductive structure 12 is flush with a lower surface of the second thermally insulating spacer layer 14 (the surface of the second thermally insulating spacer layer 14 away from the base substrate 11).

The first substrate 1 includes a first surface 111 and a second surface 112 opposite to each other. The lower surface of the electrically insulating and thermally conductive structure 12 and the lower surface of the second thermally insulating spacer layer 14 together form the second surface 112, which is opposite to the second substrate 2, that is, the second surface 112 is the lower surface of the first substrate 1. The upper surface of the electrically insulating and thermally conductive structure 12 and the upper surface of the first thermally insulating spacer layer 13 together form the first surface 111, and the first surface 111 is the upper surface of the first substrate 1. In some embodiments, an orthographic projection of the first thermally insulating spacer layer 13 on the base substrate 11 coincides with an orthographic projection of the second thermally insulating spacer layer 14 on the base substrate 11, and the first thermally insulating spacer layer 13 and the second thermally insulating spacer layer 14 are respectively provided on two opposite surfaces of the base substrate 11. As shown in FIG. 1, the thermally insulating spacer layer (including the first thermally insulating spacer layer 13 and the second thermally insulating spacer layer 14) is grid-shaped, and grid cells of the grid (i.e., the opening areas of the first and second thermally insulating spacer layers 13 and 14) correspond to the display areas of the pixels 5. The cross-section of the electrically insulating and thermally conductive structure 12 is I-shaped, and the electrically insulating and thermally conductive structure 12 fills the through holes 15 of the base substrate 11 and the opening areas of the first and second thermally insulating spacer layers 13 and 14.

It should be noted that the electrically insulating and thermally conductive structure 12 is made of a transparent material. In some embodiments, the electrically insulating and thermally conductive structure 12 may be made of a transparent thermally conductive silica gel, which can not only meet the display requirement, but also conduct heat of a finger to the thermoelectric generator 4 during touch.

The first thermally insulating spacer layer 13 and the second thermally insulating spacer layer 14 are made of a non-transparent material. In some embodiments, the first thermally insulating spacer layer 13 and the second thermally insulating spacer layer 14 may be made of a ceramic fiber, which can prevent heat from being conducted among the pixels to affect display effect.

Referring to FIGS. 1 and 3, a specific structure and arrangement of the thermoelectric generator 3 will be described in detail below. The thermoelectric generator 3 may include at least one conductive post set each including a first conductive post and a second conductive post. The at least one conductive post set is sequentially connected in series, and the first conductive post in the first conductive post set and the second conductive post in the last conductive post set are connected to the display unit, respectively. The first conductive post and the second conductive post have different Seebeck coefficients. In a case where the thermoelectric generator 3 includes one conductive post set, the first conductive post and the second conductive post in the one conductive post set are connected to the display unit, respectively.

In an example shown in FIG. 3, the thermoelectric generator 3 includes two conductive post sets, namely, a first conductive post set 31 and a second conductive post set 32. The first conductive post set 31 and the second conductive post set 32 each include a first conductive post 33 and a second conductive post 34. The first conductive post 33 and the second conductive post 34 in the first conductive post set 31 are connected to each other, and the first conductive post 33 and the second conductive post 34 in the second conductive post set 32 are connected to each other. The second conductive post 34 in the first conductive post set 31 is connected to the first conductive post 33 in the second conductive post set 32, thereby connecting the first conductive post set 31 and the second conductive post set 32 in series. The first conductive post 33 in the first conductive post set 31 and the second conductive post 34 in the second conductive post set 32 are connected to the display unit 4, respectively. The Seebeck coefficients of the first conductive post 33 and the second conductive post 34 in each conductive post set are different, that is, the first conductive post 33 and the second conductive post 34 have different thermoelectric characteristics.

All of the conductive posts in the thermoelectric generator 3 are connected in series (head-to-tail). In the first conductive post set 31 and the second conductive post set 32, the first conductive post 33 and the second conductive post 34 may be connected by a first conductive sheet 35, and the second conductive post in the first conductive post set 31 and the first conductive post 33 in the second conductive post set 32 may be connected by a second conductive sheet 36. The first conductive sheet 35 is provided on the electrically insulating and thermally conductive structure 12 of the first substrate 1 (for example, directly on the electrically insulating and thermally conductive structure 12 of the first substrate 1), and the second conductive sheet 36 is provided on the second substrate 2 (for example, directly on the second substrate 2). The first conductive sheet 35 and the second conductive sheet 36 may be metal sheets.

The first conductive post 33 and the second conductive post 34 in each conductive post set may be semiconductors, and one of the first conductive post 33 and the second conductive post 34 is a P-type semiconductor and the other is an N-type semiconductor. In an embodiment of the present disclosure, the first conductive post 33 may be a P-type semiconductor, and the second conductive post 34 may be an N-type semiconductor.

It should be noted that only the case where the thermoelectric generator 3 includes two conductive post sets is described as an example, but the present disclosure is not limited thereto. In practical applications, the number of the conductive post sets included in the thermoelectric generator 3 may be set flexibly according to the required voltage.

It could be understood that the handwritten screen of the present disclosure further includes a black matrix, and in order not to affect the aperture ratio of a pixel, each conductive post set, the first thermally insulating spacer layer 13 and the second thermally insulating spacer layer 14 are all provided in the area of the black matrix. In other words, orthographic projections of each conductive post set, the first thermally insulating spacer layer 13 and the second thermally insulating spacer layer 14 on the first substrate 1 are within an orthographic projection of the black matrix on the first substrate 1. Furthermore, in an embodiment of the present disclosure, the orthographic projection of each conductive post set on the first substrate 1 is located within the orthographic projection of the first thermally insulating spacer layer 13 or the second thermally insulating spacer layer 14 on the first substrate 1.

Next, the working principle of the thermoelectric generator will be described in detail with reference to FIGS. 4a and 4b.

Figure 4A:
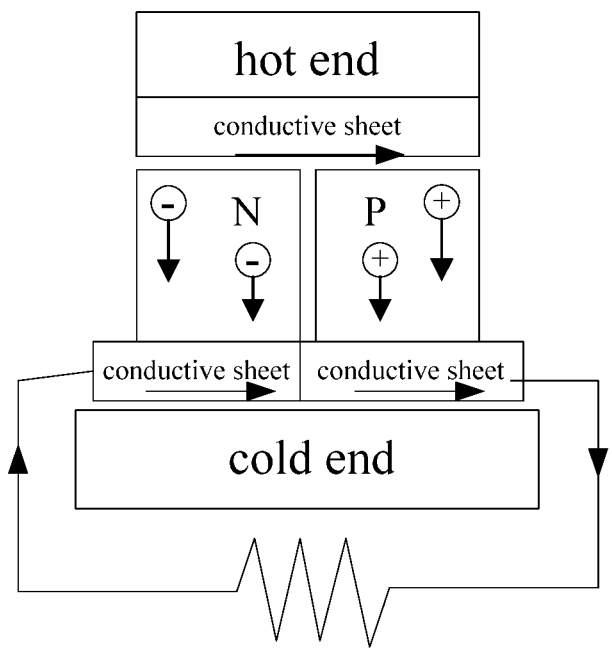
FIGS. 4a and 4b illustrate working principle of a thermoelectric generator provided in the present disclosure.
Figure 4B:
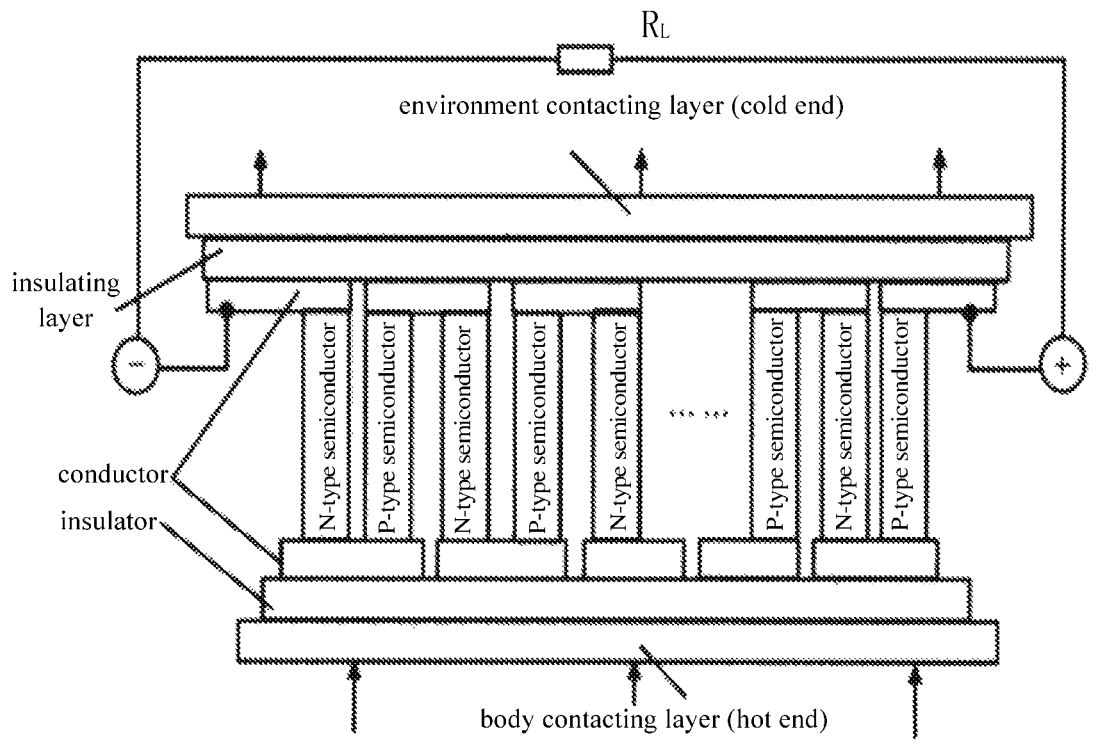

FIG. 4a shows a simple basic thermoelectric generator. The thermoelectric generator is formed by connecting two different types of semiconductors, namely, P-type semiconductor and N-type semiconductor, in series through a conductive sheet having high conductivity and fixing the conductive sheet to a ceramic piece having low thermal conductivity. When there is a difference in temperature between two ends of the semiconductor, a voltage is generated between the two ends of the semiconductor according to the Seebeck effect, and if a load resistor is connected in the loop (i.e., between the two ends of the semiconductor), a current is generated. As indicated by arrows in the figure, the current in the N-type semiconductor flows in a direction from the cold end to the hot end thereof, and the current in the P-type semiconductor flows in a direction from the hot end to the cold end thereof. The thermoelectric generator can directly convert thermal energy into electric energy when there is a slight difference in temperature, and during the conversion process, no mechanical moving part is required, and no gas or liquid medium exists. Therefore, the handwritten screen has small size and light weight, and is safe and reliable. As shown in FIG. 4b, a high voltage can be obtained by connecting multiple pairs of P-type semiconductor and N-type semiconductor to form a module.

In some embodiments, the display unit 4 may be an electronic ink display unit, which can display a first color under the action of the electric field generated by the thermoelectric generator 3. Accordingly, the handwritten screen may be an electronic paper (i.e., an electronic ink touch screen). When the difference in temperature between the first substrate 1 and the second substrate 2 is zero, the electric field is eliminated, and at this point, the thermoelectric generator 3 no longer supplies power to the display unit 4. However, due to bistability characteristics of the electronic ink, the electronic ink still maintains its current state after the electric field is eliminated, so that the handwritten screen maintains its current display state until the electric field is refreshed and the handwritten screen is cleared.

The handwritten screen of the present disclosure adopts an electronic ink display unit and does not require a backlight source, and in this way, damage to the eyes caused by blue light in the backlight source is avoided, thereby protecting a user's eyesight.

Figure 5A:
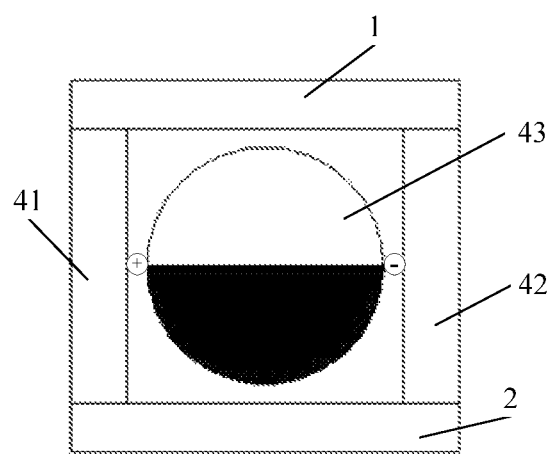
FIG. 5a is a schematic diagram illustrating a state of a display unit that is not being touched in the present disclosure.
Figure 5B:
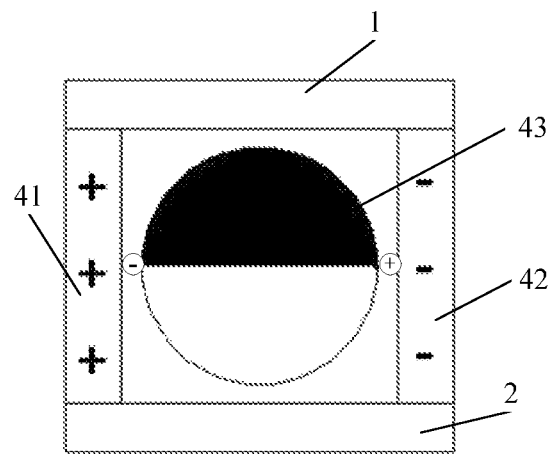
FIG. 5b is a schematic diagram illustrating a state of a display unit that is being touched in the present disclosure.

In some implementations, the display unit 4 may include a first electrode 41 and a second electrode 42 opposite to each other, a first barrier wall and a second barrier wall opposite to each other, a liquid medium, and a plurality of rotating balls 43 (FIG. 1 shows one rotating ball 43 in one display unit 4 for illustrative purpose). To clearly show the structure and working principle of the rotating ball, the first and second barrier walls and the liquid medium is omitted in the figure. The first electrode 41, the second electrode 42, the first barrier wall and the second barrier wall are perpendicular to the first substrate 1 and the second substrate 2, and the first electrode 41, the second electrode 42, the first barrier wall, the second barrier wall, the first substrate 1 and the second substrate 2 form an enclosed space, in which the liquid medium is located, and the rotating balls 43 suspend in the liquid medium. As shown in FIGS. 5a and 5b, one hemispherical surface of the rotating ball 43 has a first color, and the other hemispherical surface thereof has a second color. The first color may be black and the second color may be white.

As shown in FIG. 3, the first electrode 41 is connected to the first conductive post 33 in the first conductive post set 31 through a third conductive sheet 37, and the second electrode 42 is connected to the second conductive post 34 in the second conductive post set 32 through a fourth conductive sheet 38, the third conductive sheet 37 and the fourth conductive sheet 38 being metal sheets. When no touch occurs, as shown in FIG. 5a, the hemispherical surface of the rotating ball 43 having the first color faces the second substrate 2, and the hemispherical surface of the rotating ball 43 having the second color faces the first substrate 1, and at this time, the handwritten screen displays white.

When a finger touches the first substrate 1 (i.e., a touch occurs, and a position where the finger contacts the first substrate is a touch position, the touch position may be any position on the first substrate), as shown in FIG. 5b, the rotating ball 43 corresponding to the touch position is rotated by 180 degrees under the action of the electric field generated by the thermoelectric generator 3, so that the hemispherical surface of the rotating ball 43 having the first color faces the first substrate 1, and at this time, the handwritten screen displays black at the touch position.

In an example shown in FIG. 5a, an interface between the hemispherical surface having the first color and the hemispherical surface having the second color of the rotating ball 43 has one end coated with a transparent solution having positive ions, and the other end coated with a transparent solution having negative ions. When a touch occurs, as shown in FIG. 5b, an electric field whose direction is from the first electrode 41 to the second electrode 42 is formed in the display unit 4, and the positive and negative ions on the surface of the rotating ball 43 drive the rotating ball 43 to rotate by 180 degrees under the action of the electric field, thus obtaining the state shown in FIG. 5b.

The rotating ball 43 may also be formed by using two oppositely charged materials. For example, the left hemisphere is made of a positively charged material, the right hemisphere is made of a negatively charged material, and in this way, the rotating ball 43 can also be rotated by 180 degrees under the action of the electric field formed in the display unit 4.

It should be noted that, after the finger leaves the handwritten screen, the difference in temperature between the first substrate 1 and the second substrate 2 gradually decreases until it is eliminated, and accordingly, the electric field generated by the thermoelectric generator 3 also gradually decreases until it is eliminated. Because the rotating ball 43 has bistability characteristics, its state keeps unchanged, that is, during the process that the electric field generated by the thermoelectric generator 3 gradually decreases until it is eliminated, and after the electric field is eliminated, the rotating ball 43 maintains its current state until the electric field is refreshed and the handwritten screen is cleared.

In an embodiment, the handwritten screen may be further provided with a battery configured to store excess power generated by the thermoelectric generator. To clear the handwritten screen, the battery applies, to the electrodes on both sides of the rotating ball, an electric field whose direction is opposite to the direction of the electric field generated by the thermoelectric generator 3, so that the positive and negative ions on the surface of the rotating ball 43 drive the rotating ball 43 to rotate by 180 degrees, that is, return back to the state shown in FIG. 5b, under the action of the electric field. In another embodiment, by warming the second substrate, for example, by touching the second substrate with a finger, the thermoelectric generator 3 can generate a reverse electric field to clear the contents of the handwritten screen. Needless to say, the handwritten screen may be cleared in other ways, which is not limited in the present disclosure. For example, the rotating ball 43 may be controlled by an external electric field to return back to the state shown in FIG. 5b.

In order to clearly explain the technical solutions of the present disclosure, the working process of the handwritten screen is described in detail below.

Referring to FIGS. 1, 3, 5a, and 5b, when a finger slides across the handwritten screen, the finger, as a hot end, is in contact with the first substrate 1 of the handwritten screen, the second substrate 2 is in contact with the external environment (i.e., a cold end), and thus a difference in temperature is formed between the first substrate 1 and the second substrate 2. In an embodiment, the upper ends of the first conductive post 33 and the second conductive post 34 in the thermoelectric generator 3 are warmed, concentrations of holes and electrons at the upper ends are higher than those at the lower ends, and electrons in the second conductive post 34 (i.e., the N-type semiconductor) and holes in the first conductive post 33 (i.e., the P-type semiconductor) diffuse towards the lower ends due to the concentration gradient. Since the first conductive post 33 and the second conductive post 34 are connected head-to-tail, and the first conductive post set 31 and the second conductive post set 32 are connected to the first electrode 41 and the second electrode 42 of the display unit 4, respectively, positive charges and negative charges are generated on the first electrode 41 and the second electrode 42, respectively, due to the diffusion of the electrons and the holes, so that an electric field is formed between the first electrode 41 and the second electrode 42. The rotating ball 43 between the first electrode 41 and the second electrode 42 is rotated by 180 degrees under the action of the electric field, with the black hemispherical surface facing upwards, and at this time, the handwritten screen displays black at the touch position. When the finger leaves the handwritten screen, the difference in temperature between the first substrate 1 and the second substrate 2 gradually decreases, and the electric field between the first electrode 41 and the second electrode 42 gradually decreases, but because the specific gravity of the rotating ball 43 and the specific gravity of the liquid medium in the display unit 4 are close, the state of the rotating ball 43 keeps unchanged (i.e., the rotating ball 43 has bistability) even if the electric field is eliminated, and thus the handwritten screen still displays black at the touch position until the electric field is refreshed and the handwritten screen is cleared.

In another aspect, the present disclosure further provides a touch display device including a handwritten screen provided in the present disclosure.

In the touch display device provided in the present disclosure, the thermoelectric generator 3 and the display unit 4 connected to each other are provided correspondingly to each pixel 5 and between the first substrate 1 and the second substrate 2. When a finger touches the first substrate 1, the thermoelectric generator 3 can generate an electric field according to a difference in temperature between the first substrate 1 and the second substrate 2, so that the electric field is used to supply power to the display unit 4 to realize touch display. The present disclosure effectively utilizes a difference in temperature between a finger (i.e., the first substrate 1) and an external environment (i.e., the second substrate 2) during touch, and converts thermal energy into electrical energy to perform thermoelectric power generation, so that the existing power supply can be replaced and no power supply needs to be additionally provided. Thus, the problem of inability to supply power continuously to a handwritten screen can be fundamentally solved and the touch display device is convenient to use. Moreover, the thermoelectric generator 3 can directly convert thermal energy into electrical energy when there is a slight difference in temperature, and in the conversion process, no mechanical moving part is required, and no gas or liquid medium exists, and therefore, the touch display device has small size and light weight, and is safe and reliable.

The present disclosure provides a handwritten screen and a touch display device that require no external power supply and are eye protective by adopting the thermoelectric generator 3 and the electronic ink type display unit 4.

It could be understood that the above embodiments are merely exemplary embodiments adopted for describing the principle of the present invention, but the present invention is not limited thereto. Various variations and improvements may be made by those of ordinary skill in the art without departing from the spirit and essence of the present invention, and these variations and improvements shall also be regarded as falling into the protection scope of the present invention.

The invention claimed is:

1. A handwritten screen, comprising a plurality of pixels arranged in an array, and a first substrate and a second substrate both being electrically insulating and thermally conductive, wherein each of the plurality of pixels comprises a thermoelectric generator and a display unit connected with each other, the thermoelectric generator and the display unit are between the first substrate and the second substrate, and the thermoelectric generator generates an electric field once there is a difference between a temperature of the first substrate and a temperature of the second substrate, so as to supply power to the display unit.

2. The handwritten screen of claim 1, wherein the thermoelectric generator comprises at least one conductive post set each comprising a first conductive post and a second conductive post, the at least one conductive post set is sequentially connected in series, the first conductive post in the first conductive post set and the second conductive post in the last conductive post set are connected to the display unit, respectively, and Seebeck coefficients of the first conductive post and the second conductive post in each of the at least one conductive post set are different.

3. The handwritten screen of claim 2, wherein the thermoelectric generator comprises two conductive post sets, the second conductive post in the first conductive post set is connected to the first conductive post in the second conductive post set, and the first conductive post in the first conductive post set and the second conductive post in the second conductive post set are connected to the display unit, respectively.

4. The handwritten screen of claim 2, wherein the first conductive post and the second conductive post of each of the at least one conductive post set are semiconductors.

5. The handwritten screen of claim 4, wherein the first conductive post is a P-type semiconductor and the second conductive post is an N-type semiconductor.

6. The handwritten screen of claim 1, wherein the plurality of pixels are thermally insulated from each other.

7. The handwritten screen of claim 6, wherein the first substrate comprises: a base substrate, an electrically insulating and thermally conductive structure, and a first thermally insulating spacer layer and a second thermally insulating spacer layer both being grid-shaped, and the base substrate is provided with a plurality of through holes arranged in an array;
the first thermally insulating spacer layer and the second thermally insulating spacer layer are provided on two opposite surfaces of the base substrate, respectively, and opening areas of the first thermally insulating spacer layer and opening areas of the second thermally insulating spacer layer substantially correspond to opening areas of the pixels; and
the electrically insulating and thermally conductive structure fills the through holes of the base substrate and covers the two surfaces of the base substrate, and adjoins with the first thermally insulating spacer layer and the second thermal insulating spacer layer, respectively.

8. The handwritten screen of claim 7, wherein the electrically insulating and thermally conductive structure is made of a transparent material, and the first thermally insulating spacer layer and the second thermally insulating spacer layer are made of a non-transparent material.

9. The handwritten screen of claim 2, wherein the plurality of pixels are thermally insulated from each other.

10. The handwritten screen of claim 9, wherein the first substrate comprises: a base substrate, an electrically insulating and thermally conductive structure, and a first thermally insulating spacer layer and a second thermally insulating spacer layer both being grid-shaped, and the base substrate is provided with a plurality of through holes arranged in an array;
the first thermally insulating spacer layer and the second thermally insulating spacer layer are provided on two opposite surfaces of the base substrate, respectively, and opening areas of the first thermally insulating spacer layer and opening areas of the second thermally insulating spacer layer substantially correspond to opening areas of the pixels; and
the electrically insulating and thermally conductive structure fills the through holes of the base substrate and covers the two surfaces of the base substrate, and adjoins with the first thermally insulating spacer layer and the second thermal insulating spacer layer, respectively.

11. The handwritten screen of claim 10, wherein an orthographic projection of each of the at least one conductive post set on the first substrate is within an orthographic projection of the first thermally insulating spacer layer or the second thermally insulating spacer layer on the first substrate.

12. The handwritten screen of claim 1, wherein the display unit is configured to display a first color under the action of the electric field.

13. The handwritten screen of claim 1, wherein the display unit is an electronic ink display unit.

14. The handwritten screen of claim 2, wherein the display unit is an electronic ink display unit.

15. The handwritten screen of claim 14, wherein the display unit comprises a first electrode and a second electrode opposite to each other, a first barrier wall and a second barrier wall opposite to each other, a liquid medium and a plurality of rotating balls; the first electrode, the second electrode, the first barrier wall and the second barrier wall are perpendicular to the first substrate and the second substrate, and the first electrode, the second electrode, the first barrier wall, the second barrier wall, the first substrate and the second substrate form an enclosed space, the liquid medium is in the enclosed space, and the plurality of rotating balls suspend in the liquid medium; one hemispherical surface of each of the plurality of rotating balls has a first color, and the other hemispherical surface has a second color;
the first electrode is connected to the first conductive post in the first conductive post set, and the second electrode is connected to the second conductive post in the last conductive post set; and
in a case where there is a difference between the temperature of the first substrate and the temperature of the second substrate, the plurality of rotating balls are rotated by 180 degrees under the action of the electric field such that the hemispherical surface of each of the plurality of rotating balls having the first color faces the first substrate.

16. The handwritten screen of claim 15, wherein the first color is black and the second color is white.

17. The handwritten screen of claim 15, wherein an interface between the hemispherical surface having the first color and the hemispherical surface having the second color of each of the plurality of rotating balls has one end coated with a transparent solution having positive ions, and the other end coated with a transparent solution having negative ions.

18. The handwritten screen of claim 15, wherein the hemispherical surface having the first color and the hemispherical surface having the second color of each of the plurality of rotating balls are formed by using two oppositely charged materials.

19. The handwritten screen of claim 1, wherein the thermoelectric generator is configured to generate, when a finger touches the first substrate, an electric field according to the difference between the temperature of the first substrate and the temperature of the second substrate, so as to supply power to the display unit.

20. A touch display device, comprising the handwritten screen of claim 1.

* * * * *